United States Patent
Iancu et al.

(10) Patent No.: US 9,373,503 B2
(45) Date of Patent: Jun. 21, 2016

(54) METHOD OF FABRICATING THIN, FREESTANDING, SINGLE CRYSTAL SILICON SHEET

(71) Applicant: The Board of Trustees of the Leland Stanford Junior University, Palo Alto, CA (US)

(72) Inventors: Andrei T. Iancu, Stanford, CA (US); Friedrich B. Prinz, Woodside, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 14/503,801

(22) Filed: Oct. 1, 2014

(65) Prior Publication Data

US 2015/0118831 A1    Apr. 30, 2015

Related U.S. Application Data

(60) Provisional application No. 61/897,464, filed on Oct. 30, 2013.

(51) Int. Cl.
*H01L 21/02*    (2006.01)
*H01L 21/306*    (2006.01)

(52) U.S. Cl.
CPC .... *H01L 21/02532* (2013.01); *H01L 21/02005* (2013.01); *H01L 21/0245* (2013.01); *H01L 21/02381* (2013.01); *H01L 21/02664* (2013.01); *H01L 21/30604* (2013.01)

(58) Field of Classification Search
CPC .............. H01L 21/0262; H01L 21/02381; H01L 21/0254; H01L 21/02546; C30B 25/02
See application file for complete search history.

(56) References Cited

U.S. PATENT DOCUMENTS

| | | | | |
|---|---|---|---|---|
| 5,840,199 A | * | 11/1998 | Warren | 216/2 |
| 7,153,443 B2 | * | 12/2006 | Doan et al. | 216/58 |
| 7,981,772 B2 | * | 7/2011 | Anderson et al. | 438/478 |
| 2005/0255682 A1 | * | 11/2005 | Ghyselen et al. | H01L 21/425 438/514 |
| 2007/0190787 A1 | * | 8/2007 | Loubet et al. | 438/689 |
| 2008/0194082 A1 | * | 8/2008 | Kato et al. | 438/483 |

* cited by examiner

*Primary Examiner* — Michelle Mandala
(74) *Attorney, Agent, or Firm* — Lumen Patent Firm

(57) ABSTRACT

A method of forming a free-standing silicon film that includes providing a Si substrate, depositing a layered structure on the Si substrate, where the layered structure includes a Si device layer and a SiGe sacrificial layer, and removing the SiGe sacrificial layer with a spin etch process, where the Si device layer is released from the layered structure.

7 Claims, 2 Drawing Sheets

METHOD OF FABRICATING THIN, FREESTANDING, SINGLE CRYSTAL SILICON SHEET

CROSS-REFERENCE TO RELATED APPLICATIONS

This application claims priority from U.S. Provisional Patent Application 61/897,464 filed Oct. 30, 2013, which is incorporated herein by reference.

FIELD OF THE INVENTION

The current invention relates to the fabrication of crystal silicon sheets. More specifically, the current invention relates to a simple, high throughput method for fabricating freestanding sheets of high quality, single crystal silicon with thicknesses ranging from sub-micron levels to tens of microns.

BACKGROUND OF THE INVENTION

The fabrication of large area, ultra thin, high quality, single crystal silicon sheets is needed in the semiconductor industry. Technology companies that use or produce thin sheets of single crystal silicon require improvements in these silicon products. What is needed is a method that can produce defect-free silicon sheets with high throughput and at a very competitive cost, in addition to resultant sheets with larger surface areas and an order of magnitude smaller thickness levels than any existing, competing technique.

SUMMARY OF THE INVENTION

To address the needs in the art, a method of forming a free-standing silicon film is provided that includes providing a Si substrate, depositing a layered structure on the Si substrate, where the layered structure includes a Si device layer and a SiGe sacrificial layer, and removing the SiGe sacrificial layer with a spin etch process, where the Si device layer is released from the layered structure.

According to one aspect of the invention, the spin etch process has an etch solution that can include hydrogen peroxide, hydrogen peroxide with hydrofluoric acid, hydrogen peroxide with hydrofluoric acid plus an acetic acid stabilizer, or hydrogen peroxide with hydrofluoric acid plus an isopropyl alcohol stabilizer.

In another aspect of the invention, the spin etch process includes an etch vapor that can be hydrogen peroxide, hydrogen peroxide with hydrofluoric acid, hydrogen peroxide with hydrofluoric acid plus an acetic acid stabilizer, or hydrogen peroxide with hydrofluoric acid plus an isopropyl alcohol stabilizer.

According to a further aspect of the invention, the SiGe layer has a thickness in the range of 100 nm to 10 μm.

In yet another aspect of the invention, the spin etch process includes a spin rate in the range of 60 to 10,000 rotations per minute.

According to one aspect of the invention, the layered structure includes a plurality of the Si device layers and a plurality of the SiGe sacrificial layers, where the Si device layers alternate between the SiGe sacrificial layers, where the plurality of the Si device layers are released from the layered structure.

In a further aspect of the invention, the deposition of the layered structure includes using epitaxial CVD of the SiGe sacrificial layer and the Si device layer.

DETAILED DESCRIPTION

Figure 1A:
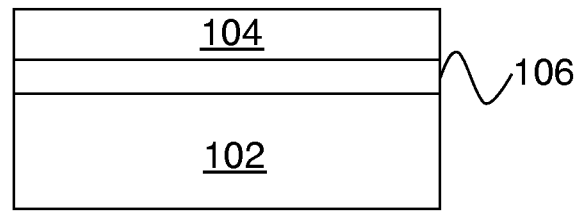
FIGS. 1a-1c show the steps of fabricating a defect-free silicon sheet with high throughput, according to one embodiment of the invention.
Figure 1B:
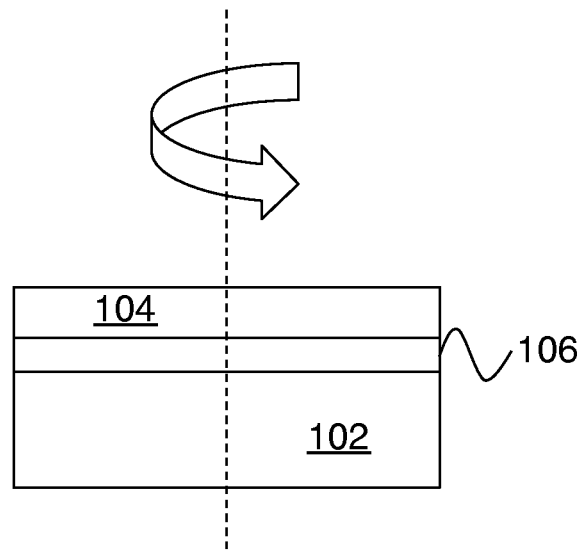
Figure 1C:
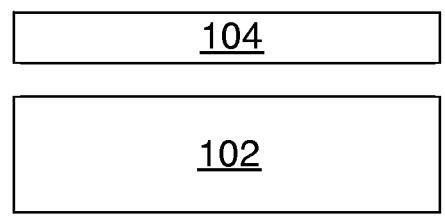

FIGS. 1a-1c show an exemplary fabrication sequence, according to one embodiment of the invention, which starts with a single crystal silicon substrate 102, a thin layer of SiGe 106 followed by a layer of silicon 104, each having desired thickness and doping are epitaxially deposited by CVD using any of the various previously developed and industrially available techniques. This resulting exemplary structure is as shown on FIG. 1a.

Subsequently, the substrate with the two deposited layers is immersed in an environment that includes an etchant, which will selectively etch only the SiGe material system. This environment may be a solution, such as hydrogen peroxide, hydrogen peroxide and hydrofluoric acid, hydrogen peroxide and hydrofluoric acid plus an additional stabilizer like acetic acid or isopropyl alcohol, and so forth. The etching environment may also be the vapor phase of any of the previously mentioned solution mixtures or, more generally, any gaseous material with the same desired selective etching properties. Next, the substrate is spun with a high velocity within the etching environment leading to the rapid removal of the intermediate SiGe layer. This step is schematically shown on FIG. 1b. Once the SiGe etching process is complete, the thin, top silicon sheet 104, which is the final product will have completely lifted off of the substrate 102 and can be gently removed, as shown on FIG. 1c. The substrate 102 can be reused for additional deposition and lift-off cycles with no adverse consequences.

Prior to the deposition of the SiGe and silicon films, the silicon substrate 102 is cleaned to remove particulate, organic and ionic contamination in order to ensure a high quality end product. There are many different techniques available from semiconductor processing to achieve this with some of the most common involving: sonication in isopropyl alcohol for at least 10 minutes to remove particles from the substrate, a standard organic contaminant cleaning step such as 10 minutes in 1:1:5 $NH_4OH:H_2O_2:H_2O$ at 75 or 80 degrees Celsius, a standard ionic contaminant cleaning step such as immersion in 1:1:5 $HCl:H_2O_2:H_2O$ at 75 or 80 degrees Celsius, and finally a simple 50:1 $H_2O:HF$ dip to remove the native oxide and passivate the surface with Si—H bonds. Additionally, although the silicon substrate may be doped and still achieve the same results, it is preferred to use an undoped substrate instead since the dopants may subtly affect the CVD deposition process of the SiGe and silicon films in potentially adverse ways.

The SiGe layer preferably includes at least 15% Ge concentration in order to facilitate the etching step since lower concentrations would result in very slow etch rates. The maximum Ge concentration will be limited by the deposition process, where higher concentrations tend to increase the crystal defect density and consequently the strain in the SiGe film such that high quality epitaxial growth of the silicon layer will be more difficult as the Ge concentration increases. The thickness of the SiGe layer should be just large enough so that the etching of the layer will occur at a desired rate. Large SiGe layer thicknesses are also undesirable because they will begin to negatively affect the number of crystal defects and material strain in the overall structure. According to the current invention, the thicknesses as low as 10 nm will work but will significantly retard the etch progression such that the total etch time will last over 20 hours for a 100 mm diameter circular area whereas with a 100 nm SiGe thickness the etch time drops to only 30 minutes. Thus, there will be a trade-off involving increasing the Ge concentration and increasing the thickness of the SiGe layer to provide the highest quality final silicon sheet with a high throughput.

The spin rate during the etching step has a more complicated effect on the etch rate but tends to be more important in cases where the etching environment is a liquid solution.

Higher spin rates improve etchant delivery to the etch sites but only to a certain point and after that they begin to have a negative effect on the etch rate. Spin rates of 6000 RPM were found to be adequate for solution environments whereas spin rates of 500 RPM rates were optimal in vapor/gaseous environments. Simply immersing the substrate in the etching environment without spinning it was ineffective due to the incredibly low etching rates of the SiGe layer across macroscopic areas without an enhanced etchant delivery mechanism.

The primary application of this fabrication technique is in the semiconductor industry where large area, ultra thin, high quality, single crystal silicon sheets are needed for device fabrication. This technique provides an improved method of fabricating silicon sheets for subsequent use in the manufacture of any semiconductor devices requiring high quality silicon thin enough to be incorporated into three-dimensional architectures. The current process for the synthesis of silicon-on-insulator wafers can also be significantly improved from both a cost and quality perspective using this invention.

This approach provides significant advantages that include defect-free silicon sheets with high throughput at a very competitive cost. Additionally, this method can produce sheets with larger surface areas and an order of magnitude smaller thickness levels than any existing, competing technique.

Figure 2A:
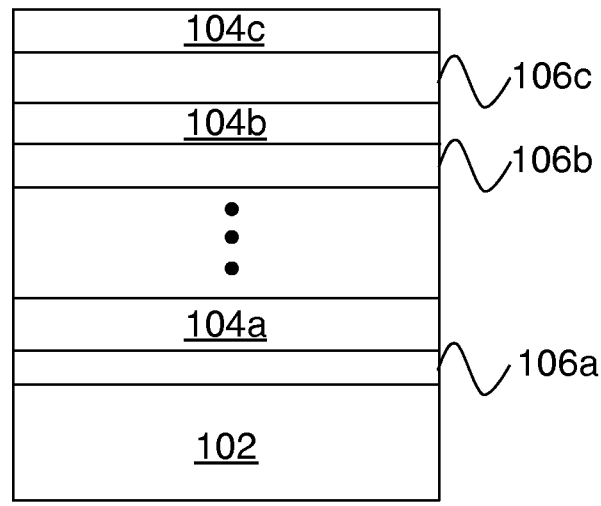
FIGS. 2a-2b show the steps of simultaneously fabricating multiple defect-free silicon sheet with high throughput, according to one embodiment of the invention.
Figure 2B:
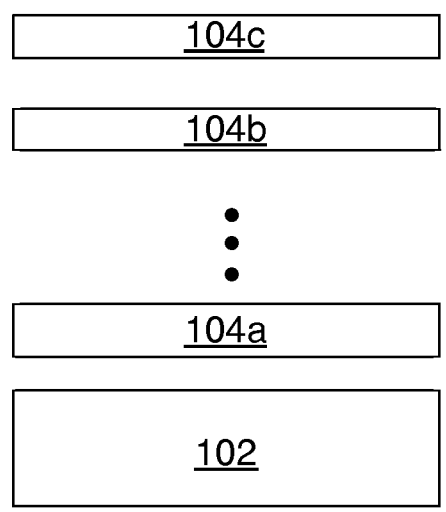

The primary variation of this technique involves modifying the CVD process to deposit a large number of alternating layers of SiGe and silicon on top of the original silicon substrate, thereby effectively boosting the throughput of this fabrication method by as much as two orders of magnitude. The only limitation to this modification involves ensuring that the quality of the additional epitaxial layers remains the same, as they are stacked on top of each other. Nevertheless, with the proper selection of deposition conditions and layer thicknesses, this can be a straightforward enhancement. FIGS. 2a-2b show an example of this approach, where multiple silicon layers 104a, 104b, and 104c are formed by selectively etching SiGe layers 106a, 106b, and 106c.

According to one embodiment of the invention, fabrication of thin, free-standing, single crystal silicon sheets is done by epitaxial CVD deposition of a SiGe sacrificial layer followed by the desired silicon layer on a silicon substrate, then subsequent removal of the SiGe layer using a solution spin etch process.

According to another embodiment of the invention, fabrication of thin, free-standing, single crystal silicon sheets is done by epitaxial CVD of a SiGe sacrificial layer followed by the desired silicon layer on a silicon substrate then subsequent removal of the SiGe layer using a vapor/gas spin etch process.

In a further embodiment of the invention, fabrication of thin, free-standing, single crystal silicon sheets is done by epitaxial CVD deposition of a SiGe sacrificial layer followed by the desired silicon layer on a silicon substrate, then subsequent removal of the SiGe layer using a solution spin etch process, where a stack is provided to include multiple alternating layers of SiGe and silicon to improve the throughput of the method.

According to yet a further embodiment, fabrication of thin, free-standing, single crystal silicon sheets is done by epitaxial CVD of a SiGe sacrificial layer followed by the desired silicon layer on a silicon substrate then subsequent removal of the SiGe layer using a vapor/gas spin etch process, where a stack is provided to include multiple alternating layers of SiGe and silicon to improve the throughput of the method.

The current invention directly solves the problem of producing ultra thin, defect free, single crystal silicon sheets for use in the fabrication of various semiconductor devices. Additionally, this method solves the problem in a way that provides high throughput at a relatively low cost.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art.

All such variations are considered to be within the scope and spirit of the present invention as defined by the following claims and their legal equivalents.

What is claimed:

1. A method of removing a free-standing silicon device layer from a Si substrate, comprising:
   a. providing a Si substrate;
   b. depositing a layered structure on said Si substrate, wherein said layered structure comprises a Si device layer and a SiGe sacrificial layer, wherein said SiGe sacrificial layer is disposed between said Si substrate and said Si device layer, wherein said SiGe layer comprises at least a 15% at Ge concentration;
   c. immersing said Si substrate and said layered structure in a liquid solution etchant bath comprising liquid hydrofluoric acid, and
   d. removing said SiGe sacrificial layer using a liquid-immersion spin etch process while said Si substrate and said layered structure are immersed in said liquid solution etchant bath, wherein a macroscopic area wafer sheet of said device layer is removed from said Si substrate when said SiGe sacrificial layer is etched away.

2. The method according to claim 1, wherein said spin etch process comprises an etch solution selected from the group consisting of hydrogen peroxide, hydrogen peroxide with hydrofluoric acid, hydrogen peroxide with hydrofluoric acid plus an acetic acid stabilizer, and hydrogen peroxide with hydrofluoric acid plus an isopropyl alcohol stabilizer.

3. The method according to claim 1, wherein said spin etch process comprises an etch vapor selected from the group consisting of hydrogen peroxide, hydrogen peroxide with hydrofluoric acid, hydrogen peroxide with hydrofluoric acid plus an acetic acid stabilizer, and hydrogen peroxide with hydrofluoric acid plus an isopropyl alcohol stabilizer.

4. The method according to claim 1, wherein said SiGe layer has a thickness in the range of 100 nm to 10 μm.

5. The method according to claim 1, wherein said spin etch process comprises a spin rate in the range of 60 to 10,000 rotations per minute.

6. The method according to claim 1, wherein layered structure comprises a plurality of said Si device layers and a plurality of said SiGe sacrificial layers, wherein said Si device layers alternate between said SiGe sacrificial layers, wherein said plurality of said Si device layers are released from said layered structure.

7. The method according to claim 1, wherein said deposition of said layered structure comprises using epitaxial CVD of said SiGe sacrificial layer and said Si device layer.

* * * * *